(12) United States Patent
Ye

(10) Patent No.: US 8,454,287 B2
(45) Date of Patent: Jun. 4, 2013

(54) FASTENER

(75) Inventor: Zhen-Xing Ye, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 262 days.

(21) Appl. No.: 12/972,511

(22) Filed: Dec. 19, 2010

(65) Prior Publication Data

US 2012/0141227 A1 Jun. 7, 2012

(30) Foreign Application Priority Data

Dec. 7, 2010 (CN) .......................... 2010 1 0577050

(51) Int. Cl.
*F16B 21/18* (2006.01)

(52) U.S. Cl.
USPC .......................................... 411/353; 411/411

(58) Field of Classification Search
USPC ................... 411/411, 413, 353, 412
See application file for complete search history.

(56) References Cited

U.S. PATENT DOCUMENTS

| | | | | |
|---|---|---|---|---|
| 3,842,223 A * | 10/1974 | Bird | ........................ | 200/61.58 B |
| 3,850,548 A * | 11/1974 | DeLancey | ........................ | 417/220 |
| 3,934,315 A * | 1/1976 | Millheiser et al. | ........................ | 24/453 |
| 4,616,967 A * | 10/1986 | Molina | ........................ | 411/105 |
| 4,664,487 A * | 5/1987 | Tam | ........................ | 359/874 |
| 5,190,219 A * | 3/1993 | Copp, Jr. | ........................ | 239/296 |
| 5,302,162 A * | 4/1994 | Pasero | ........................ | 482/54 |
| 6,263,593 B1 * | 7/2001 | Pierce et al. | ........................ | 36/118.3 |
| 6,439,816 B1 * | 8/2002 | Nance et al. | ........................ | 411/108 |
| 6,488,011 B1 * | 12/2002 | Frank et al. | ........................ | 123/456 |
| 7,641,431 B2 * | 1/2010 | Luo et al. | ........................ | 411/353 |
| 7,905,696 B2 * | 3/2011 | Chiu | ........................ | 411/353 |
| 7,922,432 B2 * | 4/2011 | Chiu | ........................ | 411/107 |
| 7,938,607 B2 * | 5/2011 | Wang | ........................ | 411/107 |
| 2005/0150347 A1 * | 7/2005 | Hannes | ........................ | 84/297 R |
| 2006/0061055 A1 * | 3/2006 | Cheng | ........................ | 280/87.042 |
| 2009/0104001 A1 | 4/2009 | Kochheiser | | |
| 2009/0220317 A1 * | 9/2009 | Travers | ........................ | 411/81 |

FOREIGN PATENT DOCUMENTS

CN 2869421 Y 2/2007
TW 205322 Y 5/1993

* cited by examiner

*Primary Examiner* — Gary Estremsky
(74) *Attorney, Agent, or Firm* — Altis Law Group, Inc.

(57) ABSTRACT

A fastener includes a post, a first and a second threaded portions extending from opposite ends of the post, a head portion extending from the first threaded portion opposite to the second threaded portion, a spring fitting about the post, and a nut screwed to the first threaded portion.

6 Claims, 3 Drawing Sheets

FASTENER

BACKGROUND

1. Technical Field

The present disclosure relates to a fastener.

2. Description of Related Art

Heat dissipation devices for cooling components in computers are generally fixed to circuit boards by screws. In most cases, screws fitted with a spring are used for fixing heat dissipation devices; so that the heat dissipation devices may contact the components perfectly to ensure the heat generated by components is removed promptly. However, the pressure applied by tension of the spring to hold an object in place cannot be adjusted, and those screws may not be useable to fix other heat dissipation devices needing different pressure.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
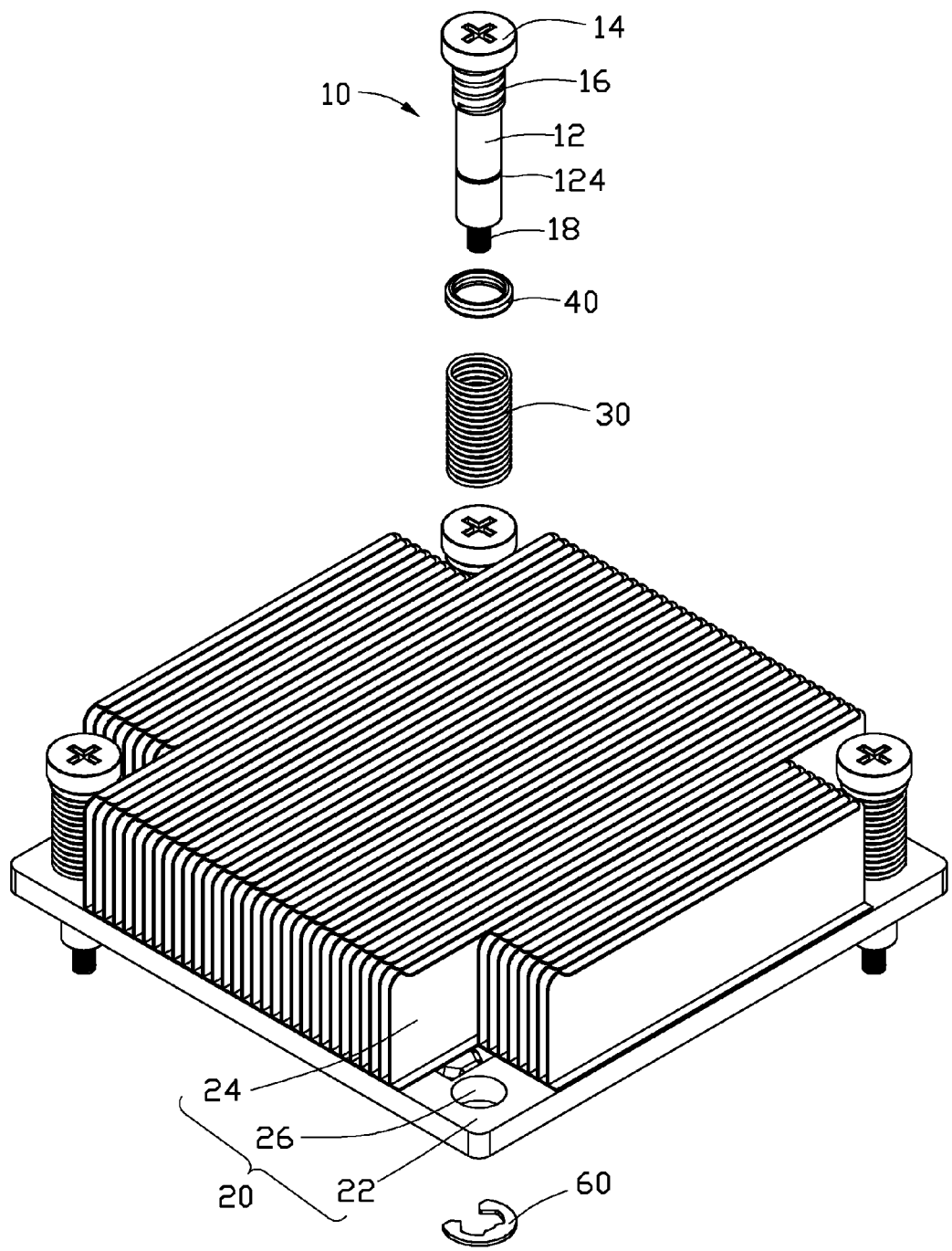
FIG. 1 is an exploded, isometric view of an exemplary embodiment of a fastener, together with a heat dissipation device.

Referring to FIG. 1, an exemplary embodiment of a fastener for fixing a heat dissipation device 20 includes a main body 10, an elastic member such as a coil spring 30, and a nut 40. In this embodiment, the heat dissipation device 20 contacts a component mounted on a circuit board (not shown).

The main body includes a post 12, a first and a second threaded portion 16 and 18 extending from opposite ends of the post 12, and a head portion 14 extending from a distal end of the first threaded portion 16 opposite to the post 12. An outer diameter of the first threaded portion 16 is larger than a diameter of the post 12, while an outer diameter of the second threaded portion 18 is less than the diameter of the post 12. A circular slot 124 is defined in the post 12, adjacent to the second threaded portion 18.

An inner diameter of the spring 30 is larger than the outer diameter of the first threaded portion 16.

The nut 40 fits about and engages with the first threaded portion 16 of the main body 10. The spring 30 is fitted about the post 12, with an end of the spring 30 abutting the nut 40.

The heat dissipation device 20 is a heat sink, and includes a substantially rectangular-shaped base 22 and a plurality of fins 24 extending from one side of the base 22. The base 22 defines a through hole 26 in each of four corners of the base 22.

Figure 2:
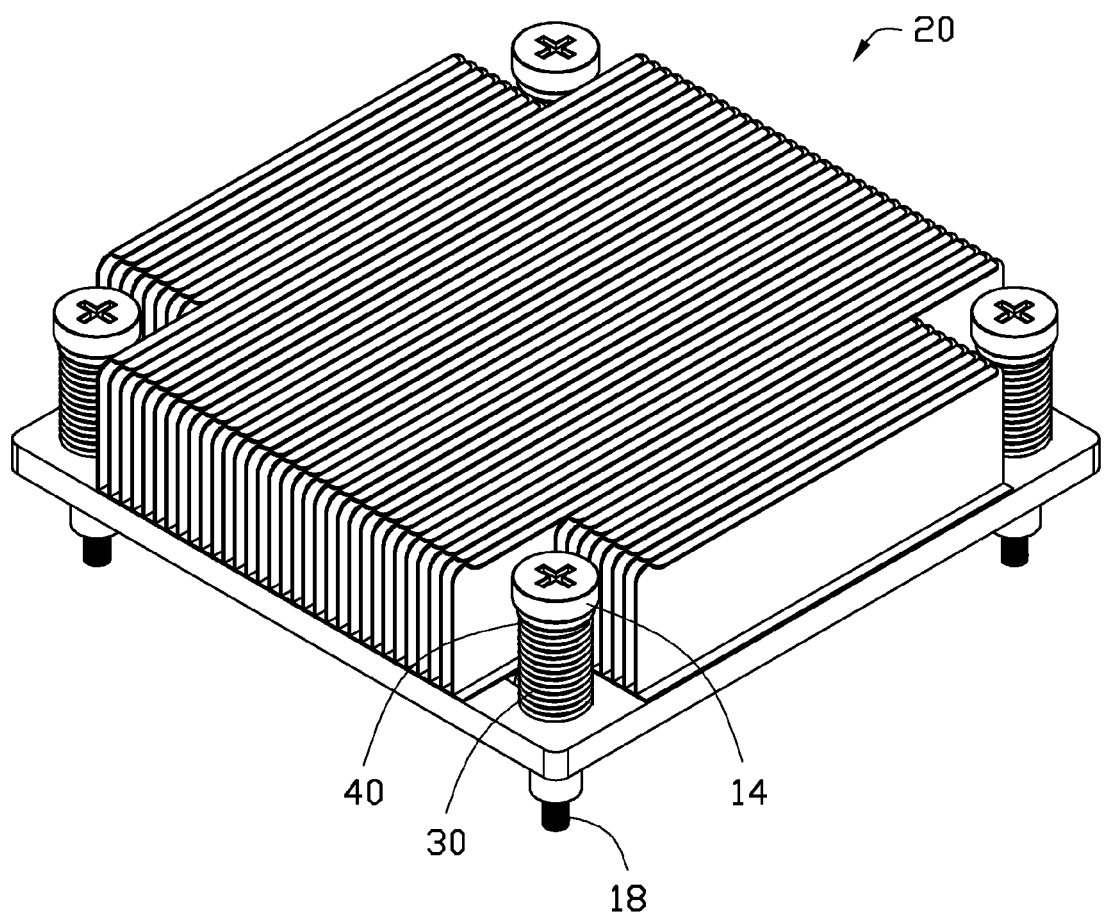
FIG. 2 is an assembled, isometric view of the fastener and the heat dissipation device of FIG. 1.
Figure 3:
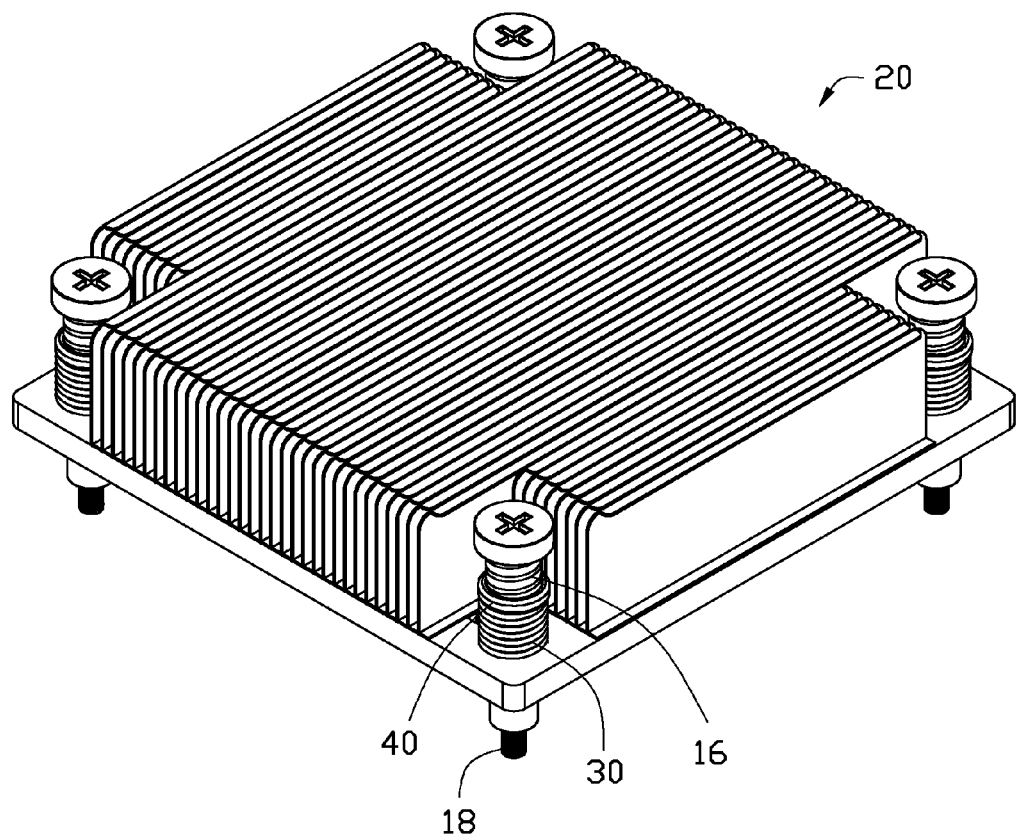
FIG. 3 is similar to FIG. 2, but shows a use state.

Referring to FIG. 2 and FIG. 3, in use, the post 12 with the second threaded portion 18 of the fastener extends through a corresponding through hole 26 of the heat dissipation device 20, until the slot 124 of the main body 10 extends out of the through hole 26 to a bottom of the base 22. A locking ring 60 engages in the slot 124 and resists against the base 22 of the heat dissipation device 20. Opposite ends of the spring 30 resists against the nut 40 and the base 22 of the heat dissipation device 20 opposite to the locking ring 60. The second threaded portion 18 of the fastener is screwed into a screw hole of the circuit board, to fix the heat dissipation device 20 to the circuit board. Therefore, the heat dissipation device 20 contacts the component mounted on the circuit board perfectly.

Further, the nut 40 may be screwed toward or away from the base 22 to adjust tension of the spring 30, thereby adjusting pressure applied on the heat dissipation device 20. Furthermore, the fastener may be used to fix different heat dissipation devices 20 with different thickness of bases.

It is believed that the present embodiments and their advantages will be understood from the foregoing description, and they will be apparent that various changes may be made thereto without departing from the spirit and scope of the description or sacrificing all of their material advantages, the examples hereinbefore described merely being exemplary embodiment.

What is claimed is:

1. A fastener, comprising:
   a post;
   a first threaded portion formed adjacent to a first end of the post;
   a head portion extending from the first end of the post;
   a nut fitting about and screwed to the first threaded portion;
   an elastic member fitting about the post, with an end abutting against a side of the nut away from the head portion, wherein the elastic member is sandwiched between the nut and an object to which the fastener is mounted, such that tension of the elastic member is adjusted by moving the nut towards or away from the object; and
   a second threaded portion extending from a second end of the post, opposite to the first threaded portion.

2. The fastener of claim 1, further comprising a locking ring, wherein an annular slot is defined in the post, adjacent to the second threaded portion, the locking ring is engaged in the slot, and wherein when the fastener is installed to the object, the elastic member and the locking ring sandwich the portion of the object where the fastener is installed.

3. The fastener of claim 1, wherein an outer diameter of the second threaded portion is less than a diameter of the post.

4. The fastener of claim 1, wherein an outer diameter of the first threaded portion is larger than a diameter of the post.

5. The fastener of claim 1, wherein the elastic member is a coil spring.

6. A fastener, comprising:
   a post;
   a first threaded portion formed adjacent to a first end of the post;
   a head portion extending from the first end of the post;
   a nut fitting about and screwed to the first threaded portion;
   a second threaded portion extending from a second end of the post, opposite to the first threaded portion;
   an elastic member fitting about the post, with an end abutting the nut; and
   a locking ring, wherein an annular slot is defined in the post, adjacent to the second threaded portion, the locking ring is engaged in the slot, and wherein when the fastener is installed to an object, the elastic member and the locking ring sandwich the portion of the object where the fastener is installed.

* * * * *